United States Patent [19]

Voss

[11] 4,352,028
[45] Sep. 28, 1982

[54] CIRCUIT ARRANGEMENT FOR REDUCING THE RECOVERY TIME OF A THYRISTOR COMPRISING R-C-D NETWORK BETWEEN AUXILIARY AND MAIN EMITTERS

[75] Inventor: Peter Voss, Munich, Fed. Rep. of Germany

[73] Assignee: Siemens Aktiengesellschaft, Berlin and Munich, Fed. Rep. of Germany

[21] Appl. No.: 264,140

[22] Filed: May 15, 1981

Related U.S. Application Data

[63] Continuation of Ser. No. 2,209, Jan. 9, 1979, abandoned.

[30] Foreign Application Priority Data

Jan. 16, 1978 [DE] Fed. Rep. of Germany ....... 2801722

[51] Int. Cl.³ .............................................. H03K 17/60
[52] U.S. Cl. .............................. 307/252 A; 307/252 C; 307/252 J; 307/305; 307/317 A; 307/318; 357/15; 357/38
[58] Field of Search ............ 307/252 A, 252 C, 252 J, 307/317 A, 305, 318; 357/15, 38

[56] References Cited

U.S. PATENT DOCUMENTS

| | | | |
|---|---|---|---|
| 3,590,346 | 6/1971 | Bilo et al. ................................ | 357/38 |
| 4,012,664 | 3/1977 | Dietrich et al. .................. | 307/252 J |
| 4,054,893 | 10/1977 | Hutson .................................. | 357/15 |
| 4,109,632 | 8/1978 | Brooks ............................. | 307/252 C |
| 4,110,638 | 8/1978 | Voss ................................. | 307/252 A |
| 4,110,775 | 8/1978 | Festa ...................................... | 357/15 |
| 4,117,393 | 9/1978 | Buck ............................... | 307/252 J |
| 4,203,047 | 5/1980 | Seki .................................. | 307/252 C |

FOREIGN PATENT DOCUMENTS 2822336 11/1978 Fed. Rep. of Germany ........ 357/38

Primary Examiner—Joseph E. Clawson, Jr.
Attorney, Agent, or Firm—Herbert L. Lerner

[57] ABSTRACT

Circuit arrangement for reducing recovery time of a thyristor formed with a semiconductor body having at least one emitter zone contacted by an emitter electrode and having at least one auxiliary emitter zone and a base zone contacted by an auxiliary emitter electrode, includes a shunt between the emitter zone and the base zone, a capacitor disposed in a line mutually connecting the emitter electrode and the auxiliary emitter electrode, the emitter electrode being the cathode and being disposed on the surface of the semiconductor body and electrically connected to the emitter zone, the shunt between the emitter zone and the base zone being formed through the capacitor, a series connection of a resistance and a diode being connected in parallel with the capacitor, the diode having a lower threshold voltage than that of an imputed diode formed by the cathode-sided emitter zone and the base zone of the thyristor, the diode of the series connection being poled with respect to the cathodic emitter electrode in the same sense as is the imputed diode of the thyristor.

5 Claims, 5 Drawing Figures

CIRCUIT ARRANGEMENT FOR REDUCING THE RECOVERY TIME OF A THYRISTOR COMPRISING R-C-D NETWORK BETWEEN AUXILIARY AND MAIN EMITTERS

This is a continuation of application Ser. No. 2,209, filed Jan. 9, 1979, abandoned.

The invention relates to a circuit arrangement for reducing recovery time of a thyristor formed with a semiconductor body having at least one emitter zone contacted by an emitter electrode and having at least one auxiliary emitter zone and a base zone contacted by an auxiliary emitter electrode, with a shunt between the emitter zone and the base zone, as well as with a capacitor connected between the emitter electrode and the auxiliary emitter electrode.

By the recovery time of a thyristor, there is meant the time between the zero crossing of the load current and the restoration of the blocking ability of the thyristor. The recovery time can be reduced considerably by the incorporation of recombination centers. Excessive doping with recombination centers, however, causes a great increase in forward losses. In the hereinaforementioned circuit, the recovery time is shortened as a result of the capacitor being charged negatively relative to the cathode by the reverse current flowing in the thyristor when the latter is switched off. Upon the recurrence of the voltage appearing in the blocking direction of the thyristor, the current produced by the charge carriers that remain stored in the semiconductor body thereby flows off through the auxiliary emitter electrode. This results in a reduction of the recovery time. The effectiveness of the heretofore known circuit arrangements of this general type is limited due to the fact that the capacitor is previously discharged through the base-emitter shunts of the thyristor before the blocking voltage returns.

It is accordingly an object of the invention of the instant application to provide an improved circuit arrangement of the foregoing general type wherein the capacitor can discharge only when the blocking voltage returns.

With the foregoing and other objects in view, there is provided, in accordance with the invention, circuit arrangement for reducing recovery time of a thyristor formed with semiconductor body and having at least one emitter zone contacted by an emitter electrode and having at least one auxiliary emitter zone and a base zone contacted by an auxiliary emitter electrode, comprising a shunt between the emitter zone and the base zone, a capacitor disposed in a line mutually connecting the emitter electrode and the auxiliary emitter electrode, the emitter electrode being the cathode and being disposed on the surface of the semiconductor body and electrically connected to the emitter zone, the shunt between the emitter zone and the base zone being formed through the capacitor, a series connection of a resistance and a diode being connected in parallel with the capacitor, the diode having a lower threshold voltage than that of an imputed diode formed by the cathode-sided emitter zone and the base zone of the thyristor, the diode of the series connection being poled with respect to the cathodic emitter electrode in the same sense as is the imputed diode of the thyristor.

In accordance with another feature of the invention, the diode of the series connection is a Schottky diode.

In accordance with a further feature of the invention the circuit arrangement includes at least one Zener diode connected in parallel with the capacitor, the Zener diode being poled with respect to the cathodic emitter electrode in the same sense as is the diode of the series connection.

In accordance with an added feature of the invention the circuit arrangement includes a primary winding of a current transformer with a saturation characteristic design in the anode-cathode circuit of the thyristor, the current transformer having a secondary winding connected through another diode to the capacitor, the other diode being poled in a manner that the capacitor is negatively charged by a reverse current flowing through the thyristor.

In accordance with a concomitant feature of the invention the circuit arrangement includes a R-C component connected in parallel with the thyristor, a primary winding of a current transformer with a saturation characteristic connected in series with the R-C component, the current transformer having a secondary winding connected through another diode to the capacitor, the other diode being poled in a manner that the capacitor is negatively charged by a reverse current flowing through the thyristor.

Other features which are considered as characteristic for the invention are set forth in the appended claims.

Although the invention is illustrated and described herein as embodied in a circuit arrangement for reducing the recovery time of a thyristor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings in which.

Figure 1:
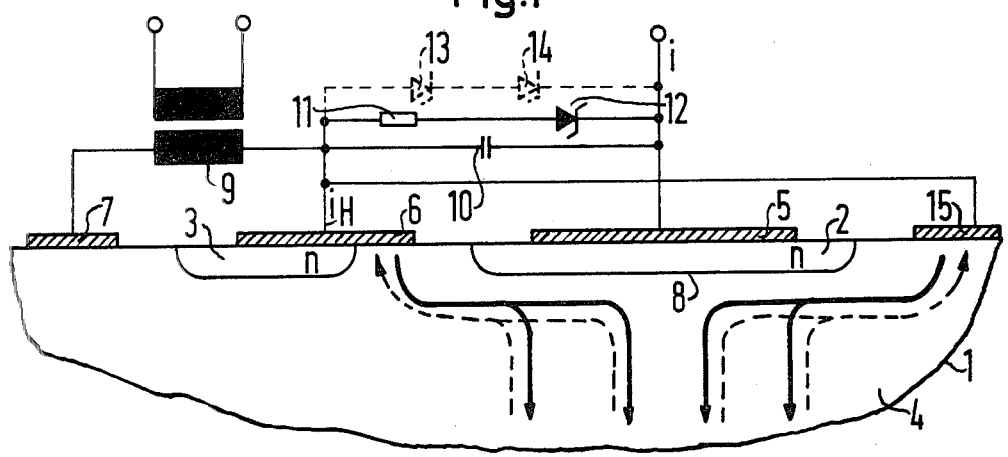
FIG. 1 is a diagrammatic and schematic view of a first embodiment of a circuit arrangement according to the invention.

Referring now to the drawing and first, particularly, to FIG. 1, thereof, part of the semiconductor body of a thyristor 1 is diagrammatically shown. It has an emitter zone 2 on the cathode side, an auxiliary emitter zone 3, and a base zone 4 also on the cathode side. Other zones of the thyristor body 1 have been omitted in the interest of greater viewing clarity. The emitter zone 2 is connected to an emitter electrode 5. The emitter electrode 5 contacts the surface of the semiconductor body only at and within the confines of the emitter zone 2 thereof. The p-n junction 8 between the emitter zone 2 and the base zone 400 is therefore not short-circuited by the emitter electrode 5 at the surface of the semiconductor body. The auxiliary emitter zone 3 is contacted by an auxiliary emitter electrode 6, 15, which is also electrically connected to the base zone. The base zone 4 is provided with a control electrode 7 directly in contact with the surface thereof. Control current is fed to the control electrode 7 through a transformer 9 having a secondary winding which is connected to the auxiliary emitter electrode 6 and the control electrode 7. A capacitor 10 is connected between and to the emitter electrode 5 and the auxiliary emitter electrode 6 and is shunted by a resistor 11 in series with a Schottky diode 12. Instead of the Schottky diode, a different diode can also be used, provided it has a threshold voltage which is lower than that of the diode formed by the zones 2 and 4 of the thyristor. A germanium diode can be used, for example, instead of a Schottky diode if the thyristor 1 is formed of silicon. The diode 12 is poled relative to the cathode in the same sense as the diode formed by the zones 2 and 4 of the thyristor 1. One or more Zener diodes 13 and 14 can be connected in parallel with the capacitor 10. The sum of the threshold voltages of the Zener diodes 13 and 14 must be greater than the threshold voltage of the diode formed by the zones 2 and 4 of the thyristor 1. The Zener voltage thereof must be lower than the breakdown voltage of the p-n junction 8, i.e. lower than 10 V, for example.

Figure 2:
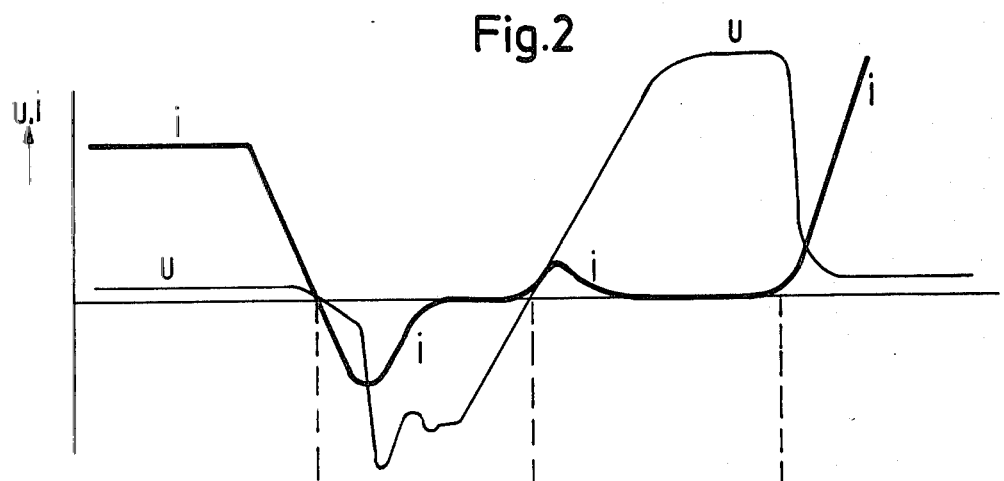
FIGS. 2 and 3 are plot diagrams showing voltage and current waveforms at characteristic points of the circuit arrangement of FIG. 1.
Figure 3:
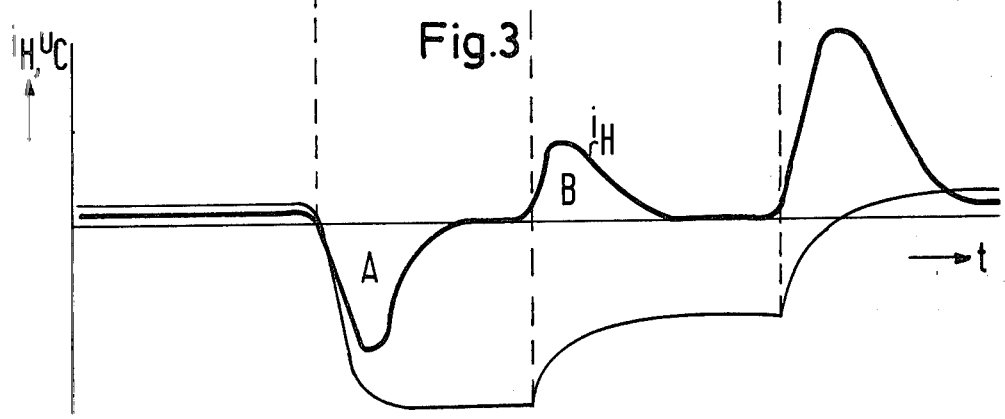

To explain the operation of the circuit arrangement of the invention according to the embodiment of FIG. 1, reference is made to the plot diagrams of FIGS. 2 and 3. These, respectively, show the cathode current i and the anode-cathode voltage U, on the other hand, and the auxiliary terminal current $i_H$ and the voltage $U_c$ at the capacitor 10, on the other hand. It will be assumed, first, that the thyristor is in conducting state. Thus, a current i determined by the driving voltage and the resistance in the load circuit flows from the anode to the cathode. A small positive forward voltage U exists across the thyristor. When the current i is commutated away at the end of a half-wave, that current i, as well as the voltage U, goes through zero and assumes negative values, as shown at A in FIG. 3. The negative current (reverse current) results from the charge carriers stored in the semiconductor body. Since transition of the emitter p-n junction 8 on the cathode side occurs into the cut-off state, the current flows through the auxiliary emitter electrode 6, 15 as indicated by the broken-line arrows and charges the capacitor 10 negatively relative to the emitter electrode 5, i.e. relative to the cathode. Since the p-n junction 8 is not short-circuited by the emitter electrode 5, the reverse current initially flows exclusively into the capacitor 10 until the break-down voltage of the p-n junction under the emitter 2 is reached. The capacitor 10 is charged negatively with respect to the cathode. The maximal capacitor voltage is determined by the Zener diodes 13, 14. Discharge of the capacitor 10 to a value below the Zener voltage is prevented by the p-n junction 8 which is biased in cut-off direction.

When positive voltage (blocking voltage) sets in, the current is likewise reversed. This is characterized by a positive current path B after a zero crossing of the voltage, as shown in FIG. 3. The current path is represented in FIG. 1 by the aforementioned broken line arrows. This current stems from as yet nonrecombined charge carriers that are stored in the semiconductor body. This current could fire the thyristor if it did not flow into the capacitor 10. The thyristor does not fire as long as the voltage at the p-n junction 8 remains below 0.3 ... 0.5 V, depending upon the temperature. This voltage is determined by the shunt resistivity of the base zone 4, the width of the emitter zone 2 and the current $i_H$. The more negatively the capacitor is charged, the more the recovery time of the thyristor is shortened, since a larger current can accordingly flow before firing occurs.

When the thyristor is fired through the control electrode 7, the load current of the auxiliary thyristor containing the auxiliary emitter zone 3 flows initially into the capacitor 10 until a voltage is reached at the auxiliary emitter electrode 6 which is higher than the threshold voltage of the diode formed by zones 2 and 4 of the thyristor. If this voltage at the auxiliary emitter electrode 6 is, for example, about 0.5 V, than the capacitor 10 is charged to about 0.5 V relative to the cathode i.e. the emitter electrode 5. In the conduction state of the thyristor, no current flows any longer into the capacitor 10. Current flows to the cathode only through the resistor 11 and the diode 12. This current can be set or adjusted by appropriate choice of the resistor 11. The current through the resistor 11 and the diode 12 can be equal to or also smaller than that current which, in the case of thyristors with conventional emitter-base shunts, would flow operationally through the shunts.

Beside recovery time, breakover resistance and du/dt limit are further characteristics of a thyristor. For the action of the circuit arrangement with respect to the breakover resistance, it is assumed that the capacitor 10 is charged positively relative to the emitter electrode 5. The cut-off current of the thyristor flows to the cathode through the resistor 11 and the diode 12. The voltage drop across the resistor 11 and the diode 12 must then remain smaller than the threshold voltage of the thyristor diode 2, 4, or, for example, 0.3 V. A current of 100 mA, for example, can flow without any emission by the emitter zone 2. In that case, the thyristor does not, therefore, fire. The function of conventional emitter short circuits is fundamentally assumed by the resistor 11 and the diode 12.

To explain the du/dt limit, a starting situation will be assumed wherein the capacitor 10 is charged negatively relative to the emitter electrode 5 or is discharged. The pulse-shaped displacement current which occurs if a voltage with a steep slope is applied, flows into the capacitor 10 and through the resistor 11 and the diode 12 to the cathode. The elements must be of such dimensions and construction, also in this case, that no voltage drop larger than about 0.3 V occurs. This can also be aided by making the emitter zone 2 narrow. In addition, the auxiliary emitter electrode 6, 15, can be subdivided and a part 15 thereof can be disposed at a side 3. Part of the current then flows through the part 15 of the auxiliary emitter electrode 6, 15, so that the voltage drop below the emitter zone 2 is reduced. In thyristors with a subdivided emitter zone, part of the auxiliary emitter electrode is then advantageously situated on both sides of all emitter zone parts and, thus, also at the outer edge of the semiconductor body. The function of the conventional emitter short circuits is, in this case, assumed fundamentally by the capacitor.

Figure 4:
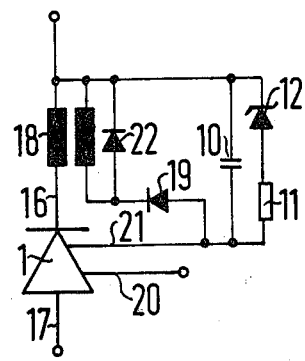
FIGS. 4 and 5 are schematic diagrams of a second and third embodiment, respectively, of the circuit arrangement.

In the circuit arrangement according to FIG. 4, the capacitor 10 is charged by the reverse current through the secondary winding of a current transformer 18 with a saturation characteristic. The primary winding of the current transformer 18 is connected into the anode-cathode circuit of the thyristor 1. The turns ratio can be 1:1, for example. Between the secondary winding of the current transformer 18 and the capacitor 10, there is disposed a diode 19 which prevents the capacitor 10 from being discharged through the secondary winding. A diode 22 is connected in parallel with the secondary winding of the current transformer 18 and is traversed by current when the thyristor carries current in forward direction. If this diode 22 is not provided, then the diode 19 must have a high cut-off capability. The primary winding of the transformer 18 could also be connected into the anode lead 16 instead of into the cathode lead 17. The lead for the control electrode and the lead for the auxiliary emitter are, respectively, identified by the reference numerals 20 and 21 of the emitter zone 2 which faces away from the auxiliary emitter component of the circuit arrangement shown in FIG. 4, are identified by the same reference characters as those of the corresponding components in FIG. 1.

Figure 5:
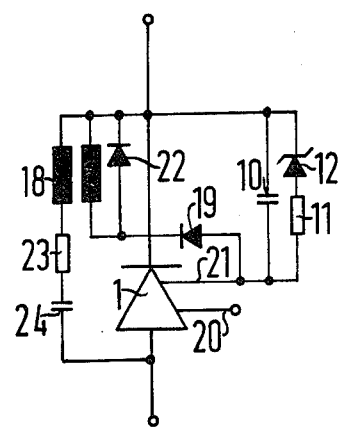

In the circuit arrangement according to FIG. 5, the primary winding of the current transformer 18 is connected in series with an R-C component 23, 24. The thus-formed series circuit is shunted across the anode-cathode path of the thyristor 1. This manner of coupling the primary winding is advantageous in complex systems, wherein the anode-cathode circuit is not readily accessible.

With the hereinaforedescribed circuit arrangement, a reduction in the recovery time can be achieved. The formation of a shunt by means of elements or components located outside the thyristor results in the emitter per se having no shunt at all. Thus, the firing process can spread unimpededly over the emitter area.

For a diameter of the semiconductor body of 50 mm, for example, the elements or components of the circuit arrangement according to the invention, can have the following dimensions:

Capacitor 10=40 μF; resistor 11=1 ohm.

The size of both of the latter components should be matched somewhat proportionally to the wafer areas.

The Schottky diode 12 should have a forward voltage of ≦0.2 V for a currrent intensity of 1 A. The areal resistance or resistivity below the emitter zone 2 can be between 50 and 500 ohms per square. The width of the emitter zone 2 should be between 1 and 5 mm i.e. the emitter can be constructed, for example, as a finger structure.

There is claimed:

1. Circuit arrangement for reducing the recovery time of a thyristor formed with a semiconductor body having a surface, at least one emitter zone, an emitter electrode contacting the surface of the semiconductor body exclusively at and within the confines of the emitter zone, at least one auxiliary emitter zone and a base zone, an auxiliary emitter electrode contacting the auxiliary emitter zone and the base zone, comprising a capacitor electrically connecting the emitter electrode with the auxiliary emitter electrode and a series connection of a resistor and a diode connected in parallel with said capacitor, said diode having a lower threshold voltage, than that of an inputed diode formed by the emitter zone and the base zone of the thyristor, said diode of said series connection being poled with respect to the emitter electrode in the same sense as is said inputed diode of the thyristor.

2. Circuit arrangement according to claim 1 wherein said diode of said series connection is a Schottky diode.

3. Circuit arrangement according to claim 1 or 2, including at least one Zener diode connected in parallel with said capacitor, said Zener diode being poled with respect to the emitter electrode in the same sense as is said diode of said series connection.

4. Circuit arrangement according to claim 1 or 2 including a primary winding of a current transformer with a saturation characteristic disposed in the anode-cathode circuit of the thyristor, said current transformer having a secondary winding connected through another diode to said capacitor, said other diode being poled in a manner that said capacitor is negatively charged by a reverse current flowing through the thyristor.

5. Circuit arrangement according to claim 1 or 2 including an R-C component connected in parallel with the thyristor, a primary winding of a current transformer with a saturation characteristic connected in series with said R-C component, said current transformer having a secondary winding connected through another diode to said capacitor, said other diode being poled in a manner that said capacitor is negatively charged by a reverse current flowing through the thyristor.

* * * * *